United States Patent [19]

Sauerwald

[11] Patent Number: 5,084,701
[45] Date of Patent: Jan. 28, 1992

[54] DIGITAL-TO-ANALOG CONVERTER USING CYCLICAL CURRENT SOURCE SWITCHING

[75] Inventor: Mark Sauerwald, San Diego, Calif.

[73] Assignee: TRW Inc., Redondo Beach, Calif.

[21] Appl. No.: 518,397

[22] Filed: May 3, 1990

[51] Int. Cl.$^5$ .............................................. H03M 1/06
[52] U.S. Cl. ...................................... 341/118; 341/144
[58] Field of Search ............... 341/118, 119, 120, 121, 341/127, 135, 144, 150, 153, 154; 323/312, 315, 317

[56] References Cited

U.S. PATENT DOCUMENTS

| | | | |
|---|---|---|---|
| 3,982,172 | 9/1976 | Van de Plassche | 323/1 |
| 4,125,803 | 11/1978 | Van de Plassche | 323/1 |
| 4,492,954 | 1/1985 | Harris et al. | 341/120 |
| 4,573,005 | 2/1986 | Van de Plassche | 323/315 |
| 4,591,828 | 5/1986 | Storey | 341/120 |
| 4,695,826 | 9/1987 | Ando et al. | 340/347 DA |
| 4,703,310 | 10/1987 | Van de Plassche | 340/347 DA |
| 4,791,406 | 12/1988 | Mehrgardt et al. | 341/144 |

OTHER PUBLICATIONS

L. Richard Carley and John Kenney, "A 16-Bit 4'th Order Noise-Shaping D/A Converter", IEEE Custom Integrated Circuits Conference, 1988, pp. 21.7.1–21.7.4.

*Primary Examiner*—A. D. Pellinen
*Assistant Examiner*—Brian K. Young
*Attorney, Agent, or Firm*—James M. Steinberger; Ronald L. Taylor

[57] ABSTRACT

A digital-to-analog (D/A) converter using cyclical current source switching to average out the errors in individual current sources. The D/A converter includes a current source switching circuit, a bank of constant current sources and a control circuit. The current source switching circuit, which is clocked by the control circuit, generates an upper and a lower pointer in accordance with a digital input signal. The upper pointer, which is advanced for an increasing digital input signal, connects current sources to an output bus. The lower pointer, which is advanced for a decreasing digital input signal, disconnects current source from the output bus. The upper and lower pointers continuously cycle through the bank of current sources to average out the errors in the individual current sources.

12 Claims, 1 Drawing Sheet

DIGITAL-TO-ANALOG CONVERTER USING CYCLICAL CURRENT SOURCE SWITCHING

BACKGROUND OF THE INVENTION

This invention relates generally to analog-to-digital and digital-to-analog converters and, more particularly, to techniques for increasing the accuracy of digital-to-analog converters.

Analog sources of information, such as voice communications and sound recordings, are increasingly being transmitted and recorded in digital form in order to improve the signal to noise ratio of the received or reproduced signal. However, to fully realize the benefits of digitization, the analog information must be accurately converted into digital form and then back again into analog form. Unfortunately, analog-to-digital (A/D) and digital-to-analog (D/A) converters introduce several types of errors into a signal, including resolution or quantization errors and linearity errors.

Quantization errors are an inherent result of the digitization process, since a continuous analog signal is being sampled and quantized into a finite number of discrete levels. For example, a flash A/D converter generally includes a bank of resistors which divide a reference voltage into a number of discrete voltage levels. The analog input voltage is compared to these discrete voltage levels to convert the analog signal into digital form. Similarly, a D/A converter generally includes a bank of constant current sources which are switched into and out of an output bus in accordance with the digital input signal, thus converting the digital signal into an analog current.

Quantization errors can be reduced by increasing the resolution of the converters, either by increasing the number of resistors and current sources or by oversampling the signal. Oversampling is a technique in which a signal is sampled at a frequency that is much higher than the sampling frequency required by Nyquist's theorem. Nyquist's theorem generally requires that the sampling frequency be at least two times higher than the highest frequency component of the signal.

In contrast, linearity errors are caused by errors in the individual resistors and current sources. For example, in a D/A converter, the same current sources are connected to the output bus for a particular digital input code. If each current source supplies slightly different amounts of current, the analog output current will have an error that depends on the digital input signal. This input-dependent error is a linearity error which can be reduced by using well-matched, high-precision current sources. However, these types of current sources are very costly.

A paper by L. Richard Carley and John Kenney entitled "A 16-Bit 4th Order Noise-Shaping D/A Converter" discloses a technique for reducing linearity errors in D/A converters. In this technique, the current sources are randomly connected to the output bus in accordance with the digital input signal. This technique averages out the errors in the individual current sources, but requires a very large number of switches. Accordingly, there is still a need for a simple technique for improving the accuracy of D/A converters. The present invention clearly fulfills this need.

SUMMARY OF THE INVENTION

The present invention resides in a digital-to-analog (D/A) converter using cyclical current source switching to average out the errors in individual current sources. The digital-to-analog converter includes a current source switching circuit, a bank of constant current sources and a control circuit. The current source switching circuit, which is clocked by the control circuit, generates an upper and a lower pointer in accordance with a digital input signal. The upper pointer, which is advanced for an increasing digital input signal, connects current sources to an output bus. The lower pointer, which is advanced for a decreasing digital input signal, disconnects current sources from the output bus. The upper and lower pointers continuously cycle through the bank of current sources to average out the errors in the individual current sources without requiring an excessive number of circuit elements.

The current source switching circuit includes two parallel paths, an upper path for generating the upper pointer and a lower path for generating the lower pointer. In an n-bit D/A converter in accordance with the present invention, the upper and lower paths each includes, in series, an adder, a register and an n-bit to $2^n$-bit decoder. An n-bit digital input is applied to the upper adder, where it is summed with an $n+1$-bit digital output of the lower register, and to the lower adder, where it is subtracted from an $n+1$-bit digital output of the upper register. The $n+1$-bit digital output of the upper adder is selectively stored in the upper register and the $n+1$-bit digital output of the lower adder is selectively stored in the lower register. The n-bit digital outputs of the upper and lower registers are the upper and lower pointers and are converted from n-bit codes into $2^n$-bit codes by the upper and lower decoders, respectively. The $2^n$-bit codes are then applied to the bank of current sources.

The control circuit includes a register, a comparator and upper and lower AND gates. The n-bit digital input is applied to the register and to the comparator. The register is clocked by a clock signal, providing a one-sample-delayed n-bit digital input to the comparator. This past sample of the digital input signal is compared to the present sample of the digital input signal by the comparator. If the present sample of the digital input signal is greater than the past sample, the upper AND gate outputs a one at the next clock pulse. This latches the output of the upper adder into the upper register, thus applying a new upper pointer to the bank of current sources to connect additional current sources to the output bus. If the past sample is greater than the present sample, the lower AND gate outputs a one at the next clock pulse. This latches the output of the lower adder into the lower register, thus applying a new lower pointer to the bank of current sources to disconnect current sources from the output bus.

A bank of switches receives the $2^n$-bit upper and lower pointers and connect the current sources to the output bus in accordance with these pointers. If the upper pointer is above the lower pointer, current sources between the upper and lower pointers will be connected to the output bus and the other current sources will be disconnected from the output bus. However, when the upper pointer is below the lower pointer, current sources between the upper and lower pointers will be disconnected from the output bus and the other current sources will be connected to the output bus. This latter inverted condition occurs when the upper pointer has advanced beyond the last current source and started over again at current source zero, while the lower pointer has not. The necessary inverting function is performed by an exclusive-OR gate, which receives as inputs the MSB's of the upper and lower registers. When one of the MSB's is a one and the other is not, the upper and lower pointers are not within the same range and the exclusive-OR gate inverts the operation of the switches.

It will be appreciated from the foregoing that the present invention represents a significant advance in the field of digital-to-analog converters. The present invention can be utilized to either increase the linearity of D/A converters or to reduce their cost by relaxing the precision requirements of the current sources. Other features and advantages of the present invention will become apparent from the following more detailed description, taken in conjunction with the accompanying drawing, which illustrates, by way of example, the principles of the invention.

DETAILED DESCRIPTION OF THE PREFERRED EMBODIMENT

Figure 1:
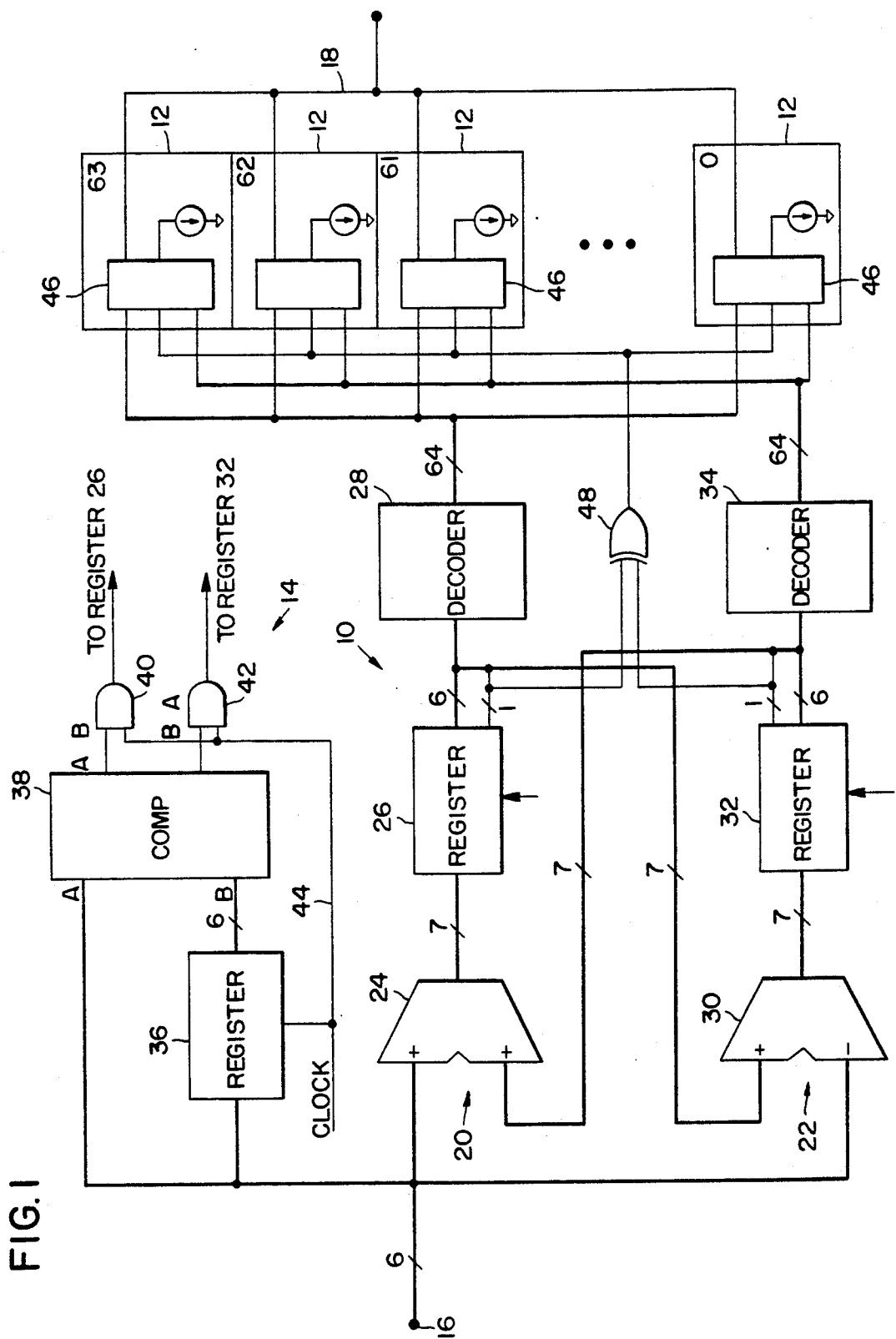
FIG. 1 is a block diagram of a digital-to-analog converter using cyclical current source switching in accordance with the present invention.

As shown in the drawing for purposes of illustration, the present invention is embodied in a digital-to-analog converter using cyclical current source switching to average out the errors in individual current sources. Analog-to-digital (A/D) and digital-to-analog (D/A) converters introduce several types of errors into a signal, including resolution or quantization errors and linearity errors. Quantization errors can be reduced by increasing the resolution of the converters, either by increasing the number of resistors and current sources or by oversampling the signal. Linearity errors in D/A converters can be reduced by using well-matched, high-precision current sources. However, these types of current sources are very costly.

As illustrated in FIG. 1, a six-bit digital-to-analog converter in accordance with the present invention includes a current source switching circuit 10, a bank of $2^6$ or sixty-four (numbered from zero to sixty-three) constant current sources 12 and a control circuit 14. The current source switching circuit 10, which is clocked by the control circuit 14, generates an upper and a lower pointer in accordance with a digital signal applied to input terminal 16. The upper pointer, which is advanced for an increasing digital input signal, connects current sources 12 to output bus 18. The lower pointer, which is advanced for a decreasing digital input signal, disconnects current sources 12 from output bus 18. The upper and lower pointers continuously cycle through the bank of current sources 12 to average out the errors in the individual current sources 12.

The current source switching circuit 10 includes two parallel paths, an upper path 20 for generating the upper pointer and a lower path 22 for generating the lower pointer. The upper path 20 includes, in series, an adder 24, a register 26 and a six-bit to sixty-four-bit decoder 28, while the lower path 22 includes, in series, an adder 30, a register 32 and a six-bit to sixty-four-bit decoder 34. The six-bit digital input is applied to adder 24, where it is summed with a seven-bit digital output of register 32, and to adder 30, where it is subtracted from a seven-bit digital output of register 26. The seven-bit digital output of adder 24 is selectively stored in register 26 and the seven-bit digital output of adder 30 is selectively stored in register 32. The six-bit digital outputs of registers 26, 32 are the upper and lower pointers and are converted from six-bit codes into sixty-four-bit codes by decoders 28, 34, respectively. The sixty-four bit codes are then applied to the bank of current sources 12.

The control circuit 14 includes a register 36, a comparator 38 and two AND gates 40, 42. The six-bit digital input is applied to register 36 and to comparator 38. The register 36 is clocked by a clock signal on line 44, providing a one-sample-delayed six-bit digital input to the comparator 38. This past sample (B) of the digital input signal is compared to the present sample (A) of the digital input signal by the comparator 38. If the present sample (A) of the digital input signal is greater than the past sample (B), AND gate 40 outputs a one at the next clock pulse. This latches the output of adder 24 into register 26, thus applying a new upper pointer to the bank of current sources 12 to connect additional current sources 12 to output bus 18. If the past sample (B) is greater than the present sample (A), AND gate 42 outputs a one at the next clock pulse. This latches the output of adder 30 into register 32, thus applying a new lower pointer to the bank of current sources 12 to disconnect current sources 12 from output bus 18.

A bank of switches 46 receive the sixty-four-bit upper and lower pointers and connect the current sources 12 to output bus 18 in accordance with these pointers. If the upper pointer is above the lower pointer, current sources 12 between the upper and lower pointers will be connected to output bus 18 and the other current sources 12 will be disconnected from output bus 18. However, when the upper pointer is below the lower pointer, current sources 12 between the upper and lower pointers will be disconnected from output bus 18 and the other current sources 12 will be connected to output bus 18. This latter inverted condition occurs when the upper pointer has advanced beyond current source sixty-three and started over again at current source zero, while the lower pointer has not. The necessary inverting function is performed by exclusive-OR gate 48, which receives as inputs the MSB's of the two registers 26, 32. When one of the MSB's is a one and the other is not, the upper and lower pointers are not within the same range and the exclusive-OR gate 48 inverts the operation of switches 46.

As an example of the operation of the D/A converter of the present invention, assume a digital input of thirty (011110) is applied to terminal 16, with the upper pointer being ten and the lower pointer being zero. The present sample of thirty is greater than the past sample of ten, causing AND gate 40 to output a one at the next clock pulse and store the output of adder 24 as the new upper pointer in register 26. The output of adder 24 is the sum of thirty and zero, or thirty. With an upper pointer of thirty and a lower pointer of zero, current sources eleven through thirty are connected to output bus 18, current sources one through ten remain connected to output bus 18, and current source zero and current sources thirty-one through sixty-three remain disconnected from output bus 18.

If the next digital input is twenty (010100), the present sample of twenty is less than the past sample of thirty, causing AND gate 42 to output a one at the next clock pulse and store the output of adder 30 as the new lower pointer in register 32. The output of adder 30 is the difference between thirty and twenty, or ten. With an upper pointer of thirty and a lower pointer of ten, current sources one through ten are disconnected from output bus 18, current sources eleven through thirty remain connected to output bus 18 and current source zero and current sources thirty-one through sixty-three remain disconnected from output bus 18.

If the next digital input is sixty (111100), the present sample of sixty is greater than the past sample of twenty, causing AND gate 40 to output a one at the next clock pulse and store the output of adder 24 as the new upper pointer in register 26. The output of adder 24 is the sum of sixty and ten, or seventy. However, only six bits are applied to decoder 28 and the bank of current sources 12, resulting in an upper pointer of six (seventy minus sixty-four). The MSB or seventh bit is applied to the exclusive-OR gate 48, which inverts the operation of switches 46. With an upper pointer of six and a lower pointer of ten, but with the switches 46 being inverted, current sources thirty-one through sixty-four and current sources zero through six are connected to output bus 18, current sources eleven through thirty remain connected to output bus 18, and current sources seven through ten remain disconnected from output bus 18.

From the foregoing, it will be appreciated that the present invention represents a significant advance in the field of digital-to-analog converters. The present invention can be utilized to either increase the linearity of D/A converters or to reduce their cost by relaxing the precision requirements of the current sources. Although a preferred embodiment of the invention has been shown and described, it will be apparent that other adaptations and modifications can be made without departing from the spirit and scope of the invention. Accordingly, the invention is not to be limited, except as by the following claims.

I claim:

1. A digital-to-analog (D/A) converter for converting an n-bit digital input signal into an analog signal, comprising:

$2^n$ constant current sources;

an output bus;

current source switching means for generating an upper pointer and a lower pointer in accordance with the digital input signal, the upper pointer connecting current sources to the output bus and the lower pointer disconnecting current sources from the output bus, the current source switching means including upper path means for generating the upper pointer and lower path means for generating the lower pointer, the upper and lower path means each including, in series, an adder, a register and an n-bit to $2^n$-bit decoder; and control means for clocking the current source switching means;

wherein the upper pointer is advanced for an increasing digital input signal and the lower pointer is advanced for a decreasing digital input signal, whereby the upper and lower pointers continuously cycle through the current sources to average out errors in the current sources.

2. The digital-to-analog converter as set forth in claim 1, wherein the n-bit digital input signal is applied to the upper and lower adders, the n-bit digital input being summed in the upper adder with an n+1-bit digital output of the lower register and the n-bit digital input being subtracted in the lower adder from an n+1-bit digital output of the upper register, the n+1-bit digital output of the upper adder being selectively stored in the upper register and the n+1-bit digital output of the lower adder being selectively stored in the lower register.

3. The digital-to-analog converter as set forth in claim 2, wherein the n-bit digital output of the upper register is the upper pointer and the n-bit digital output of the lower register is the lower pointer, the upper pointer being converted from an n-bit code into a $2^n$-bit code by the upper decoder and the lower pointer being converted from an n-bit code into a $2^n$-bit code by the lower decoder.

4. The digital-to-analog converter as set forth in claim 3, wherein the control means includes a register and a comparator, the n-bit digital input signal being applied to the register and comparator and the register providing a one-sample-delayed n-bit digital input to the comparator, the comparator indicating whether the digital input signal is increasing or decreasing in magnitude.

5. The digital-to-analog converter as set forth in claim 4, wherein the control means further includes upper and lower AND gates, the upper AND gate latching the output of the upper adder into the upper register for an increasing digital input signal as indicated by the comparator and the lower AND gate latching the output of the lower adder into the lower register for a decreasing digital input signal as indicated by the comparator.

6. The digital-to-analog converter as set forth in claim 3, and further including a plurality of switches for receiving the $2^n$-bit upper and lower pointers and connecting the current sources to the output bus in accordance with the pointers, the current sources between the upper and lower pointers being connected to the output bus and the other current sources being disconnected from the output bus when the upper pointer is above the lower pointer and the current sources between the upper and lower pointers being disconnected from the output bus and the other current sources being connected to the output bus when the upper pointer is below the lower pointer.

7. A digital-to-analog (D/A) converter, comprising:

current source switching means for generating an upper pointer and a lower pointer in accordance with a digital input signal, the upper pointer connecting current sources to an output bus and the lower pointer disconnecting current sources from the output bus, the current source switching means including upper path means for generating the upper pointer and lower path means for generating the lower pointer, the upper and lower path means each including, in series, an adder, a register and an n-bit to $2^n$-bit decoder;

wherein the upper pointer is advanced for an increasing digital input signal and the lower pointer is advanced for a decreasing digital input signal, whereby the upper and lower pointers continuously cycle through the current sources to average out errors in the current sources.

8. The digital-to-analog converter as set forth in claim 7, wherein the n-bit digital input signal is applied to the upper and lower adders, the n-bit digital input being summed in the upper adder with an n+1-bit digital output of the lower register and the n-bit digital input being subtracted in the lower adder from an n+1-bit digital output of the upper register, the n+1-bit digital output of the upper adder being selectively stored in the upper register and the n+1-bit digital output of the lower adder being selectively stored in the lower register.

9. The digital-to-analog converter as set forth in claim, 8, wherein the n-bit digital output of the upper register is the upper pointer and the n-bit digital output of the lower register is the lower pointer, the upper pointer being converted from an n-bit code into a $2^n$-bit code by the upper decoder and the lower pointer being converted from an n-bit code into a $2^n$-bit code by the lower decoder.

10. The digital-to-analog converter as set forth in claim 9, and further including control means for clocking the current source switching means, wherein the control means includes a register and a comparator, the n-bit digital input signal being applied to the register and comparator and the register providing a one-sample-delayed n-bit digital input to the comparator, the comparator indicating whether the digital input signal is increasing or decreasing in magnitude.

11. The digital-to-analog converter as set forth in claim 10, wherein the control means further includes upper and lower AND gates, the upper AND gate latching the output of the upper adder into the upper register for an increasing digital input signal as indicated by the comparator and the lower AND gate latching the output of the lower adder into the lower register for a decreasing digital input signal as indicated by the comparator.

12. The digital-to-analog converter as set forth in claim 9, and further including a plurality of switches for receiving the $2^n$-bit upper and lower pointers and connecting the current sources to the output bus in accordance with the pointers, the current sources between the upper and lower pointers being connected to the output bus and the other current sources being disconnected from the output bus when the upper pointer is above the lower pointer and the current sources between the upper and lower pointers being disconnected from the output bus and the other current sources being connected to the output bus when the upper pointer is below the lower pointer.

* * * * *